United States Patent
Nagai

(10) Patent No.: US 6,808,825 B2
(45) Date of Patent: Oct. 26, 2004

(54) COPPER ALLOY FOIL

(75) Inventor: Hifumi Nagai, Hitachi (JP)

(73) Assignee: Nikko Metal Manufacturing Co., Ltd., Ibaraki-ken (JP)

( * ) Notice: Subject to any disclaimer, the term of this patent is extended or adjusted under 35 U.S.C. 154(b) by 0 days.

(21) Appl. No.: 10/216,025

(22) Filed: Aug. 9, 2002

(65) Prior Publication Data

US 2003/0108766 A1 Jun. 12, 2003

(30) Foreign Application Priority Data

Aug. 10, 2001 (JP) ........................................ 2001-244874
Aug. 20, 2001 (JP) ........................................ 2001-249609

(51) Int. Cl.$^7$ .......................... B32B 15/04; B32B 15/08; B32B 15/20; B32B 27/28

(52) U.S. Cl. ........................ 428/626; 428/674; 428/332; 428/336; 428/458; 428/473.5

(58) Field of Search ................................. 428/457, 624, 428/671, 674, 220, 332, 458, 470, 473.5, 474.4, 901, 336; 420/469, 470, 471, 473, 474, 475, 476, 477, 489, 497

(56) References Cited

U.S. PATENT DOCUMENTS

| | | | | |
|---|---|---|---|---|
| 4,731,128 A | * | 3/1988 | Casullo | 428/470 |
| 5,004,520 A | * | 4/1991 | Tsuji et al. | 156/630 |
| 5,077,005 A | * | 12/1991 | Kato | 420/469 |
| 6,221,176 B1 | * | 4/2001 | Merchant et al. | 148/264 |
| 2002/0155021 A1 | * | 10/2002 | Nagai et al. | 420/492 |
| 2002/0192460 A1 | * | 12/2002 | Kawaguchi et al. | 428/341 |
| 2003/0096082 A1 | * | 5/2003 | Nagai et al. | 428/141 |

* cited by examiner

*Primary Examiner*—Michael La Villa
(74) *Attorney, Agent, or Firm*—Jordan and Hamburg LLP

(57) ABSTRACT

For a two-layer printed wiring board including a polyimide substrate produced with varnish containing polyamic acid as the raw material for the polyimide and a copper alloy foil laminated with the polyimide substrate, there is provided, for the copper alloy foil, a copper alloy containing, in addition to copper and unavoidable impurities, either (1) 0.02 to 1.0 weight percent Ag and/or 0.01 to 0.5 weight percent In or (2) alloy composition (1) plus a total of 0.005 to 2.5 weight percent of at least one of the additional elements Al, Be, Co, Fe, Mg, Mn, Ni, P, Pb, Si, Ti and Zn, or (3) 0.001 to 0.5 weight percent Sn or (4) alloy composition (3) plus a total of 0.005 to 2.5 weight percent of at least one of the additional elements of alloy composition (2) and each of (1), (2), (3) and (4) preferably having a heat resistance of at least 300° C.

5 Claims, No Drawings

COPPER ALLOY FOIL

BACKGROUND OF THE INVENTION

The present invention relates to a copper alloy foil used in a laminate for a printed wiring board.

Printed wiring boards are used frequently in the electronic circuitry of electronic equipment. Printed wiring boards are classified broadly as either rigid laminates (i.e., rigid boards) or flexible laminates (i.e., flexible boards), according to the type of resin serving as the substrate. Flexible boards, which are characterized by flexibility, are used not only for wiring in flexible regions but also as space-saving wiring material, because they can be housed within electronic equipment in the folded state. Also, because the board itself is thin, it also can be used in semiconductor package interposer applications and as a liquid-crystal display IC tape carrier. In flexible boards, polyimide often is used as the resin that serves as the substrate, and copper generally is used as the conductive material because of its conductivity. Structurally, a flexible board is either a three-layer flexible board or a two-layer flexible board. A three-layer flexible board is structured such that a resin film (e.g., polyimide) and a copper foil, the conductive material, are bonded by means of an adhesive (e.g., epoxy resin, acrylic resin). On the other hand, a two-layer flexible board is structured such that copper, the conductive material, is adhesively bonded directly to a resin (e.g., polyimide). The term "resin" as used throughout the present specification and claims means "synthetic polymer".

In a printed wiring board, the copper foil of the copper-clad laminate is etched to form various wiring patterns, after which electronic components are connected and mounted by means of solder. However, heat resistance is required because the material of a printed wiring board is subjected repeatedly to such high temperatures. In recent years, lead-free solder has been used more frequently to protect the environment. However, because its melting point is higher than that of conventional lead solder, the heat resistance requirement of flexible boards has become more stringent. As a result, in two-layer flexible boards, only polyimide resin, which has excellent heat resistance, is used as an organic material, so heat resistance can be improved more easily than in three-layer flexible boards, which use adhesives with inferior heat resistance (e.g., epoxy resins, acrylic resins). Thus the usage of polyimide resins has increased.

The principal methods used to produce two-layer flexible boards with a polyimide resin as the substrate are the metallization method, the lamination method, and the casting method. In the metallization method, a method such as sputtering is used to deposit a thin layer of metal (e.g., Cr) on a polyimide film, after which sputtering, plating or the like, is used to form the necessary thickness of copper, the conductive material of the printed wiring board. So, no copper foil is used. In the lamination method, copper foil, which serves as the conductive material of the printed wiring board, is laminated directly onto the polyimide film. In the casting method, varnish containing polyamic acid, the precursor of polyimide resin, the substrate, is applied to a copper foil, the conductive material of the printed wiring board, and the polyimide film formed by thermosetting becomes the resin substrate.

With the miniaturization, weight-saving, and enhanced functionality of electronic equipment in recent years, there has been increased demand for high-density mounting on printed wiring boards, resulting in finer pitches with narrower line or wire widths and line or wire spacing in electronic circuits. If copper foil with high surface roughness or copper foil with irregularities formed by means of a roughening plating process is used as the conductive material, when a circuit is formed by etching, etching residue containing residual copper remains in the resin, so the etching linearity drops, leading to nonuniform circuit widths. As a result, copper foil with low surface roughness is preferable, to enable finer pitches in an electronic circuit. Also, higher-frequency electrical signals are being utilized in electronic equipment (e.g., PCs, mobile telecommunications). However, when the electrical signal frequency exceeds 1 GHz, the skin effect (i.e., the flow of current only on the surface of a conductor) becomes significant, so the effect of variation in the transmission path caused by surface irregularities can no longer be disregarded. Therefore, attempts were made to form a metal film on a flat polyimide film, as in the metallization method, thereby reducing the surface roughness of the copper foil used in the lamination method or the casting method.

The copper foil that serves as the conductive material in a printed wiring board is classified as a rolled copper foil or an electrolytic copper foil, depending on its production process. Electrolytic copper foil is produced by electrolytically depositing copper from a copper sulfate plating bath onto a titanium or stainless steel drum. However, it has become possible to produce so-called low-profile foil, which is copper foil produced by adding additives to the plating bath and then regulating the electrolytic deposition conditions to reduce the surface roughness. Rolled copper foil is produced by using a rolling roll to plastically form it, so the surface pattern of the rolling roll is transferred to the foil surface, thereby yielding a smooth surface. Furthermore, the foil generally is less than 100 $\mu$m thick.

To improve its adhesion to a resin, the copper foil used in a printed wiring board is subjected to a roughening plating process that utilizes electroplating to form copper particles on the surface of the copper foil. This improves the adhesion by means of the so-called anchor effect, which forms irregularities on the copper foil surface and causes the copper foil to bite into the resin, thereby yielding a mechanical adhesive strength. For the aforesaid reasons, however, it is desirable to bond a copper foil with low surface roughness to a resin film, without performing roughening plating processing, so it is necessary to maintain the adhesive strength without performing roughening processing. Also, in a three-layer flexible board, an attempt was made to coat copper foil with a silane coupling agent, and so forth, in order to improve the adhesive strengths of the copper foil, which is a metal, and the adhesive, which is an organic material. However, because the 300–400° C. production temperature used for a two-layer flexible board is higher than the 100–200° C. temperature used for a three-layer flexible board, the coupling agent pyrolyzes readily, so the adhesion has not improved.

A copper alloy containing pure copper and small quantities of additional elements is used as the raw material of the copper foil used as the conductive material. As finer pitches are utilized in electronic circuits, the copper foil (i.e., the conductor) thins and the circuit narrows, so two copper foil properties are desired: low DC resistance loss and high conductivity. Copper is a material with excellent conductivity, so pure copper with a purity above 99.9% generally is used in the aforesaid field, where conductivity is important. However, copper's strength decreases as its purity increases, so if the copper foil is thinned, its handleability deteriorates. Therefore, a high copper foil strength is preferable. Also, for a two-layer flexible board, as in the case of a casting method, it is necessary to perform heat treatment for 10 min. to approximately 1 hour, at an elevated temperature (300° C. to 400° C.), when synthesizing polyimide from polyamic acid, the temperature and time being inversely proportional and at higher temperatures within the aforementioned range the copper foil softening, thereby reducing handleability. Therefore, it is preferable to avoid softening by heat treating at 300° C. for approximately 1 hour.

Under such circumstances, an attempt was made to produce a two-layer flexible board with a polyimide resin as the substrate, by using a casting method. After varnish containing polyamic acid, the precursor of polyimide, was applied to the copper alloy foil instead of adhering the polyimide film to the copper alloy foil, polyimide film was formed by thermosetting. As a result, it was determined that, depending on the state of the copper alloy foil's surface, the wettability with varnish containing polyamic acid sometimes was poor, so varnish adhered unevenly, making it difficult to obtain a uniformly thick polyimide film after thermosetting.

SUMMARY OF THE INVENTION

The present invention provides a copper alloy foil for a laminate such that, when a casting method is used to produce a two-layer printed wiring board with a polyimide resin as the substrate, the wettability of the copper alloy foil with varnish containing polyamic acid is improved, so it is possible to create a uniformly thick polyimide film after thermosetting, without uneven varnish adhesion; and such that it yields an adhesive strength greater than or equal to a 180° peel strength of 8.0 N/cm, without performing special processing (e.g., roughening plating processing), so the strength is high and the handleability is superior.

After studying the cause of uneven varnish adhesion after coating a copper alloy foil with varnish containing polyamic acid, the inventors discovered that the wettability of copper alloy foil with the varnish sometimes was poor because of the anticorrosive coating for preventing the tarnishing of the copper alloy foil. An organic compound (e.g., benzotriazole, imidazole) which forms a chelate with copper frequently is used to prevent the tarnishing of pure copper and copper alloys. Excellent wettability with varnish containing polyamic acid was achieved by controlling the thickness of these anticorrosive coatings, so it was possible to obtain a uniform polyimide film thickness after thermosetting. It also was discovered that the adhesion with polyimide having polyamic acid as the raw material was improved by using a copper alloy that was based on pure copper, which has superior conductivity, and that contained small quantities of additional elements. Moreover, sufficient adhesion with the film formed by thermosetting polyamic acid was obtained even without roughening processing. Concretely, as a result of considerable research regarding the effects of various additional elements on such properties as the wettability of the anticorrosive coating with polyamic acid, and on the adhesion of copper alloy foil to polyimide formed by thermosetting the polyamic acid, the present invention provides.

(1) a copper alloy foil for a laminate, characterized in that it contains at least one of Ag (0.02–1.0 weight percent) and In (0.01–0.5 weight percent), and the remainder consists of copper and unavoidable impurities; it has an anticorrosive coating less than 5 nm thick; its conductivity is at least 80% IACS; the wettability of the copper alloy foil with varnish containing polyamic acid is good; and the 180° peel strength between the copper alloy foil and a film produced by thermosetting polyamic acid without roughening processing is at least 8.0 N/cm.;

(2) a copper alloy foil for a laminate, characterized in that it contains at least one of Ag (0.02–1.0 weight percent) and In (0.01–0.5 weight percent), and furthermore it contains a total of 0.005–2.5 weight percent of at least one of Al, Be, Co, Fe, Mg, Mn, Ni, P, Pb, Si, Ti, and Zn, with the remainder consisting of copper and unavoidable impurities; it has an anticorrosive coating less than 5 nm thick; its tensile strength is at least 500 N/mm$^2$; its conductivity is at least 60% IACS; the wettability of the copper alloy foil with varnish containing polyamic acid is good; and the 180° peel strength between the copper alloy foil and a film produced by thermosetting polyamic acid without roughening processing is at least 8.0 N/cm;

(3) a copper alloy foil for a laminate, characterized in that it contains 0.01–0.5 weight percent Sn, and the remainder consists of copper and unavoidable impurities; the anticorrosive coating to less than 5 nm thick; its conductivity is at least 70% IACS; the wettability of the copper alloy foil with varnish containing polyamic acid is good; and the 180° peel strength between the copper alloy foil and a film produced by thermosetting polyamic acid without roughening processing is at least 8.0 N/cm.;

(4) a copper alloy foil for a laminate, characterized in that it contains 0.01–0.5 weight percent Sn, and furthermore it contains a total of 0.005–2.5 weight percent of at least one of Al, Be, Co, Fe, Mg, Mn, Ni, P, Pb, Si, Ti, and Zn, with the remainder consisting of copper and unavoidable impurities; the anticorrosive coating thickness is less than 5 nm thick; its tensile strength is at least 500 N/mm$^2$; its conductivity is at least 60% IACS; the wettability of the copper alloy foil with varnish containing polyamic acid is good; and the 180° peel strength between the copper alloy foil and a film produced by thermosetting polyamic acid without roughening processing is at least 8.0 N/cm.

(5) the copper alloy foil for a laminate described in (1)–(4), characterized in that the temperature at which the tensile strength after heating for one hour is intermediate between the tensile strength before heating and the tensile strength after softening is at least 300° C. That temperature is characterized herein as "heat resistance".

The reasons for the aforesaid limitations on the surface state, the alloy composition, and so forth, in the present invention will be discussed next.

(1) Anticorrosive coating: Tarnishing of pure copper and copper alloys commonly is prevented by using an organic material containing nitrogen (e.g., benzotriazole, imidazole) to form a chelate with the copper on the surface, thereby forming an anticorrosive coating. On the other hand, these anticorrosive coatings are water-repellent, so they reduce the wettability with liquids, causing varnish containing polyamic acid to be repelled. So, by limiting the anticorrosive coating thickness to less than 5 nm, it becomes possible to achieve a uniform varnish coating thickness, so it becomes possible to reduce variation in the thickness of polyimide obtained by heating the polyamic acid to cause an imidization reaction. The anticorrosive coating thickness may be reduced by reducing the concentration of the anticorrosive agent, for example. When using benzotriazole as the anticorrosive agent, it is preferable to reduce the concentration to less than 5000 ppm. The thickness of the anticorrosive coating can be quantified by measuring by means of Auger electron spectroscopy. That is, Auger electron spectroscopy can be used to analyze in the depth direction. So the depth from the surface of the copper alloy foil to the point at which the detected intensity of nitrogen, the element that constitutes the anticorrosive agent, equals that of the background is measured.

(2) Ag, In, Sn: It is known that, during the production of a resin, Ag and In function as catalysts that promote polymerization. As a result, it is believed that the addition of these to copper during alloy foil production promotes bonding between the metal and the polyimide resin, thereby strengthening the interfacial bond. If too little of Ag or In is added, their catalytic function is insufficient, so the metal and the resin are bonded insufficiently, resulting in little improvement in adhesion. It is necessary to impart a 180° peel strength of at least 8.0 N/cm to avoid problems during its application to printed wiring boards. It was determined that, to obtain this property, the added amounts of Ag and In must be at least 0.02 weight percent and 0.01 weight percent, respectively, by weight.

Also, the heat resistance is improved by dissolving Ag and In in copper, and Ag and In have little effect on the conductivity, so a copper alloy foil containing a small quantity of silver is a suitable conductive material. However, if too much Ag or In is added to copper, the conductivity drops, thereby yielding a conductive material unsuitable for circuits. As a result, after an investigation of the appropriate compositions for the copper alloy foil for a laminate of a printed wiring board, it was determined that the preferable weight ratio of Ag is 0.02–1.0 weight percent, more preferably 0.04–0.5 weight percent, and that of In preferably is 0.01–0.5 weight percent, more preferably 0.02–0.3 weight percent. Sn has the same effect, so a suitable concentration of Sn in for a copper alloy foil for a laminate of a printed wiring board was determined to be a 0.01–0.5 weight percent, more preferably 0.02–0.2 weight percent.

(3) Tensile strength and conductivity: Strength and conductivity generally are related inversely, so the higher the material strength, the lower the conductivity tends to be.

However, high conductivity, for example, at least 80% IACS may be required even if the strength is inferior. On the other hand, if then tensile strength is less than 500 N/mm$^2$, handling, and the like, readily produces wrinkles. But, as the tensile strength increases, the conductivity decreases. When the conductivity of the copper alloy foil is less than 60% IACS, it is not preferred as the conductive material for a laminate. The conditions appropriate for a copper alloy foil for a laminate with high strength and superior handleability were determined to be a tensile strength of at least 500 N/mm$^2$ and a conductivity of at least 60% IACS.

(4) Al, Be, Co, Fe, Mg, Mn, Ni, P, Pb, Si, Ti, and Zn: Ag has the effect of strengthening copper alloys. Particularly with respect to handleability, however, when high strength is required, it is effective to add a further element. Al, Be, Co, Fe, Mg, Mn, Ni, P, Pb, Si, Ti, and Zn each has the effect of strengthening copper alloys by means of solid solution strengthening or hardening, so at least one is added as necessary. When the total content is less than 0.005 weight percent, the aforementioned desired effect is not obtained. On the other hand, if the total content exceeds 2.5 weight percent, the conductivity, solderability, and workability deteriorate considerably. Consequently, the total content range for Al, Be, Co, Fe, Mg, Mn, Ni, P, Pb, Si, Ti, and Zn was determined to be 0.005 weight percent to 2.5 weight percent.

(5) 180° peel strength: When the 180° peel strength is low, there is danger of peeling from the laminate, so an adhesive strength, i.e., 180° peel strength, of at least 8.0 N/cm is required.

The method of producing the copper alloy foil of the present invention will be discussed next. An ingot is made by adding a specific quantity of alloy elements to fused, pure copper and then casting this in a mold. Copper alloy fusion and casting are inhibited by the generation of oxides, and so forth, so it is preferable to perform them in a vacuum or in an inert gas atmosphere. It also is preferable to use electrolytic copper with a low oxygen content or oxygen-free copper as the raw material. Hot rolling is used to thin the ingot to a certain thickness, after which the top layer is scraped off and the ingot is subjected to repeated cold rolling and annealing. Finally, cold rolling is performed to finish the foil. The rolling-finished material is coated with rolling oil, so acetone, or other petroleum solvent, is used for degreasing.

If an oxide layer is formed during annealing, it will cause trouble in subsequent processing, so it is necessary either to perform annealing in a vacuum or in an inert gas atmosphere, or to remove the oxide layer after annealing. For example, to remove the oxide layer by pickling, it is preferable to use sulfuric acid+hydrogen peroxide, nitric acid+hydrogen peroxide, or sulfuric acid+hydrogen peroxide+a fluoride.

DETAILED DESCRIPTION OF THE INVENTION

The embodiments of the present invention will be explained next.

For copper alloy production, oxygen-free copper, the principal raw material, was fused in an Ar atmosphere in a high-purity graphite crucible, by using a high-frequency vacuum induction melting furnace. To this were added, as auxiliary materials, additional materials selected from among silver, indium, aluminum, a copper-beryllium master alloy, cobalt, copper-iron master alloy, magnesium, manganese, nickel, copper-phosphorous master alloy, lead, copper-silicon master alloy, titanium, and zinc. This was then cast in a cast iron mold. This method yielded a copper alloy ingot that was 30 mm thick, 50 mm wide, 150 mm long, and weighed approximately 2 kg. This ingot was heated to 900° C., and hot rolling was used to roll it to a thickness of 8 mm. The oxide scale was then removed, after which cold rolling and heat treatment were repeated to obtain a copper alloy foil roll-finished to a thickness of 35 μm.

Rolling oil adhered to the 35-μm-thick copper alloy foil obtained by means of the aforesaid method, so the foil was immersed in acetone to remove the oil. It was then immersed in an aqueous solution containing 10 weight percent sulfuric acid and 1 weight percent hydrogen peroxide, to remove the surface oxide layer and the anticorrosive coating. To investigate the effects of the anticorrosive coating thickness, the foil was then immersed in an aqueous solution with a regulated benzotriazole concentration and then dried immediately. Other than this, no special surface processing (e.g., roughening plating processing, silane coupling processing) was used to improve adhesion. The copper alloy foil prepared in this manner was attached to a coating machine, and an applicator was used to apply varnish containing polyamic acid and N-methylpyrrolidone as the solvent. The solvent was evaporated from the varnish film in a vacuum dryer, after which, as the final step, the film was maintained at 350° C. for 10 min. to form a polyimide film by thermosetting the polyamic acid, thereby yielding a copper-clad laminate consisting of two layers: polyimide and a copper alloy. Here, the polyimide film thickness was approximately 50 μm.

The following methods were used to evaluate the tensile strength, conductivity, heat resistance, anticorrosive coating thickness, varnish applicability, and strength of adhesion with polyimide film, of the copper alloy foil obtained in this manner:

(1) Tensile strength: The tensile strength was measured at room temperature by means of a tensile strength test. The measurement sample was obtained by using a precision cutter to cut, into 12.7-mm-wide and 150-mm-long strips, the copper foil processed to a thickness of 35 μm. This was measured at a tension speed of 50 mm/min. and a gauge length of 50 mm.

(2) Conductivity: Regarding the conductivity, the electrical resistance at 20° C. was determined by using a DC four-probe method that utilized a double bridge. For the measurement sample, copper foil processed to a thickness of 35 μm was cut to a width of 12.7-mm. The conductivity was determined by measuring the electrical resistance at an inter-measurement length of 50 mm.

(3) Heat resistance : The heat resistance was evaluated by measuring the tensile strength at room temperature after heating for 1 hour, and by then utilizing, as the softening temperature, a heating temperature that yields a tensile strength between the tensile strength before heating and the tensile strength after softening.

(4) Anticorrosive coating thickness : As mentioned previously, Auger electron spectroscopy was used to perform depth profiling, and the depths from the surface to the points at which the detected intensity of nitrogen (i.e., the element that constituted the anticorrosive agent) equaled the background were measured.

(5) Varnish applicability: After the copper foil was coated with varnish containing polyamic acid, the varnish state was observed. In the tables, the symbol ○ is used to indicate no repellency, and the symbol x is used to indicate repellency.

(6) Adhesive strength: Regarding the adhesive strength, the 180° peel strength was measured in conformity with the method described in JIS C 5016. For the measurement, double-sided tape was used to attach the polyimide side to the tensile tester, and the copper alloy foil was peeled off by bending it in the 180° direction. With the peel width set at 5.0 mm, the adhesive strength was measured at a tension speed of 50 mm/min.

EXAMPLES 1–9

(Tables 1 and 2) are examples of the aforementioned embodiments in which the copper alloy foil contains Ag and/or In and has a heat resistance of at least 300° C. Table 1 lists the compositions of the copper alloy foils, and Table 2 lists their characteristic evaluation results.

As shown in Table 2, the copper alloy foil of the present invention has a conductivity of at least 80% IACS and a 180° peel strength after polyimide adhesion of at least 8.0 N/cm. It has superior heat resistance, the varnish applicability is good, and it has high strength of adhesion with polyimide.

TABLE 1

| | Chemical Composition (weight %) | | | | | | | | | | | | | |
|---|---|---|---|---|---|---|---|---|---|---|---|---|---|---|
| No. | Ag | In | Al | Be | Co | Fe | Mg | Mn | Ni | P | Pb | Si | Ti | Zn | Cu & Unavoidable Impurities |
| 1 | 0.03  | —     | — | — | — | — | — | — | — | — | — | — | — | — | Remainder |
| 2 | 0.096 | —     | — | — | — | — | — | — | — | — | — | — | — | — | Remainder |
| 3 | 0.41  | —     | — | — | — | — | — | — | — | — | — | — | — | — | Remainder |
| 4 | 0.83  | —     | — | — | — | — | — | — | — | — | — | — | — | — | Remainder |
| 5 | —     | 0.013 | — | — | — | — | — | — | — | — | — | — | — | — | Remainder |
| 6 | —     | 0.052 | — | — | — | — | — | — | — | — | — | — | — | — | Remainder |
| 7 | —     | 0.24  | — | — | — | — | — | — | — | — | — | — | — | — | Remainder |
| 8 | —     | 0.44  | — | — | — | — | — | — | — | — | — | — | — | — | Remainder |
| 9 | 0.22  | 0.2   | — | — | — | — | — | — | — | — | — | — | — | — | Remainder |

TABLE 2

| No. | Tensile Strength (N/mm$^2$) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 1 | 410 | 99 | 300 | 1 | ○ | 8.1 |
| 2 | 430 | 97 | 350 | 1 | ○ | 9.1 |
| 3 | 470 | 92 | 370 | 2 | ○ | 10.3 |
| 4 | 480 | 83 | 380 | 1 | ○ | 10.6 |
| 5 | 410 | 99 | 320 | 1 | ○ | 8.3 |
| 6 | 460 | 97 | 350 | 2 | ○ | 9.9 |
| 7 | 490 | 88 | 380 | 1 | ○ | 11.7 |
| 8 | 510 | 82 | 390 | 1 | ○ | 12.9 |
| 9 | 500 | 85 | 380 | 1 | ○ | 11.9 |

EXAMPLES 10–14

(Tables 3 and 4) are examples of the aforementioned embodiments in which the copper alloy foil contains Ag and/or In and at least one of Al, Be, Co, Fe, Mg, Mn, Ni, P, Pb, Si, Ti and Zn and has a heat resistance of at least 300° C. Table 3 lists the compositions of the copper alloy foils, and Table 4 lists their characteristic evaluation results.

As shown in Table 4, the copper alloy foil of the present invention has a conductivity of at least 60% IACS, a tensile strength of at least 500 N/mm$^2$, and a 180° peel strength after polyimide adhesion of at least 8.0 N/cm. It is evident that it has superior heat resistance and strength, the varnish applicability is good, and it has high strength of adhesion with polyimide.

an Ar atmosphere was processed into foil, after which this was, adhered to polyimide. Because the raw material was pure copper, the conductivity was high. However, insufficient adhesive strength (180° peel strength : 7.5 N/cm) was

TABLE 3

| No. | Chemical Composition (weight %) |  |  |  |  |  |  |  |  |  |  |  |  | Cu & Unavoidable |
|---|---|---|---|---|---|---|---|---|---|---|---|---|---|---|
|  | Ag | In | Al | Be | Co | Fe | Mg | Mn | Ni | P | Pb | Si | Ti | Zn Impurities |
| 10 | 0.1 | — | 0.1 | 0.096 | 0.2 | — | — | — | — | — | — | — | — | — Remainder |
| 11 | 0.1 | — | — | — | — | — | 0.045 | 0.048 | — | — | — | — | — | — Remainder |
| 12 | 0.2 | — | — | — | — | — | — | — | — | — | 0.056 | — | 0.21 | — Remainder |
| 13 | — | 0.2 | — | — | — | 0.2 | — | — | 0.15 | — | 0.043 | — | — | 0.1 Remainder |
| 14 | — | 0.2 | — | — | — | — | — | — | — | 0..06 | — | 0.11 | — | — Remainder |

TABLE 4

| No. | Tensile Strength (N/mm$^2$) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 10 | 650 | 74 | 390 | 1 | ○ | 10.7 |
| 11 | 550 | 83 | 440 | 2 | ○ | 13.4 |
| 12 | 680 | 65 | 450 | 2 | ○ | 10.3 |
| 13 | 600 | 72 | 450 | 1 | ○ | 12.8 |
| 14 | 540 | 84 | 370 | 2 | ○ | 11.1 |

Table 5 lists the compositions of copper alloy foils of comparative examples, and Table 6 lists their characteristic evaluation results. Nos. 15–19 are comparative examples related to embodiments of the present invention in which the copper alloy foil contains Ag and/or In and has a heat resistance of at least 300° C. No. 15 is a rolled copper foil with no added alloy components of the present invention. An ingot produced by fusing and casting oxygen-free copper in an Ar atmosphere was processed into foil, after which this was, adhered to polyimide. Because the raw material was pure copper, the conductivity was high. However, insufficient adhesive strength (180° peel strength : 7.5 N/cm) was obtained, so there was danger of peeling after use in a printed wiring board.

TABLE 5

| No. | Chemical Composition (weight %) |  |  |  |  |  |  |  |  |  |  |  |  | Cu & Unavoidable |
|---|---|---|---|---|---|---|---|---|---|---|---|---|---|---|
|  | Ag | In | Al | Be | Co | Fe | Mg | Mn | Ni | P | Pb | Si | Ti | Zn Impurities |
| 15 | — | — | — | — | — | — | — | — | — | — | — | — | — | — Remainder |
| 16 | 0.015 | — | — | — | — | — | — | — | — | — | — | — | — | — Remainder |
| 17 | 1.3 | — | — | — | — | — | — | — | — | — | — | — | — | — Remainder |
| 18 | — | 0.008 | — | — | — | — | — | — | — | — | — | — | — | — Remainder |
| 19 | — | 0.55 | — | — | — | — | — | — | — | — | — | — | — | — Remainder |
| 20 | 0.19 | — | — | — | — | — | — | — | 0.2 | 2.7 | — | — | — | — Remainder |
| 21 | — | 0.19 | — | — | — | — | — | — | — | — | — | — | 2.8 | — Remainder |
| 22 | 0.41 | — | — | — | — | — | — | — | — | — | — | — | — | — Remainder |

TABLE 6

| No. | Tensile Strength (N/mm$^2$) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 15 | 400 | 99 | 140 | 2 | ○ | 7.5 |
| 16 | 400 | 99 | 220 | 1 | ○ | 7.6 |
| 17 | 480 | 77 | 380 | 2 | ○ | 13 |
| 18 | 400 | 99 | 280 | 1 | ○ | 7.8 |
| 19 | 530 | 78 | 390 | 1 | ○ | 13.1 |
| 20 | 690 | 35 | 450 | 1 | ○ | 7.8 |
| 21 | 910 | 14 | 450 | 1 | ○ | 13.8 |
| 22 | 430 | 97 | 350 | 7 | X | — |

IN COMPARATIVE EXAMPLES 16–19,

Ag or In was added, after which the foil was processed by means of the same method used for the invention examples. Because the Ag concentration was low in No. 16, the conductivity was high. However, the effect was insufficient to improve the heat resistance and the adhesiveness. The 180° peel strength was low, so there was danger of peeling after this was processed in a laminate. In No. 17, on the other hand, Ag was added to a concentration exceeding 1.0 weight percent, so the heat resistance and the 180° peel strength were high. However, the conductivity dropped below 80% IACS, so it was not suitable as the conductive material of a printed wiring board, which requires high conductivity. Similarly, in No. 18, the In concentration was low, so the conductivity was high. However, the effect was insufficient to improve the heat resistance and the adhesiveness; and in No. 19, In was added to a concentration exceeding 0.5 weight percent, by weight, so the conductivity dropped below 80% IACS. Therefore, it was not suitable as the conductive material of a printed wiring board, which requires high conductivity.

Nos. 20 and 21 are comparative examples related to the embodiment of the present invention in which the copper alloy foil contains Ag and/or In and at least one of Al, Be, Co, Fe, Mg, Mn, Ni, P, Pb, Si, Ti and Zn. In No. 20, P and Ni were added in addition to Ag. In No. 21, Ti was added in addition to Ag. Then the foil was processed in the same manner as the invention examples. The added amount of P or Ti exceeded 2.5 weight percent, so the conductivity dropped below 70% IACS, making it unsuitable as the conductive material of a printing wiring board.

COMPARATIVE EXAMPLE 22

Was processed by immersing the alloy foil of invention Example 2 in an aqueous solution with a benzotriazole concentration regulated at 7000 ppm. As a result, as the anticorrosive coating thickened to 7 nm, the wettability with varnish containing polyamic acid decreased, so varnish repellency was detected. This made it impossible to obtain a uniform polyimide film, so it was impossible to measure the 180° peel strength.

EXAMPLES 23–26

(Tables 7 and 8) are examples of the aforementioned embodiments in which the copper alloy foil contains Sn and has a heat resistance of at least 300° C. Table 7 lists the compositions of the copper alloy foils, and Table 8 lists their characteristic evaluation results.

As shown in Table 8, the copper alloy foil of the present invention has a conductivity of at least 70% IACS, and a 180° peel strength after polyimide adhesion of at least 8.0 N/cm. It is evident that it has superior heat resistance, the varnish applicability is good, and it has high strength of adhesion with polyimide.

TABLE 7

| | Chemical Composition (weight %) | | | | | | | | | | | | |
|---|---|---|---|---|---|---|---|---|---|---|---|---|---|
| No. | Sn | Al | Be | Co | Fe | Mg | Mn | Ni | P | Pb | Si | Ti | Zn | Cu & Unavoidable Impurities |
| 23 | 0.015 | — | — | — | — | — | — | — | — | — | — | — | — | Remainder |
| 24 | 0.050 | — | — | — | — | — | — | — | — | — | — | — | — | Remainder |
| 25 | 0.18 | — | — | — | — | — | — | — | — | — | — | — | — | Remainder |
| 26 | 0.40 | — | — | — | — | — | — | — | — | — | — | — | — | Remainder |

TABLE 8

| No. | Tensile Strength (N/mm$^2$) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 23 | 420 | 98 | 300 | 1 | ○ | 8.4 |
| 24 | 450 | 95 | 360 | 1 | ○ | 10.0 |
| 25 | 480 | 82 | 380 | 1 | ○ | 11.3 |
| 26 | 490 | 73 | 390 | 1 | ○ | 12.1 |

EXAMPLES 27–31

(Tables 9 and 10) are examples of the aforementioned embodiments in which the copper alloy foil contains Sn and at least one of Al, Be, Co, Fe, Mg, Mn, Ni, P, Pb, Si, Ti and Zn and has a heat resistance of at least 300° C. Table 9 lists the compositions of the copper alloy foils, and Table 10 lists their characteristic evaluation results.

As shown in Table 10, the copper alloy foil of the present invention has a conductivity of at least 60% IACS, a tensile strength of at least 500 N/mm$^2$, and a 180° peel strength after polyimide adhesion of at least 8.0 N/cm. It is evident that it has superior heat resistance and strength, the varnish applicability is good, and it has high strength of adhesion with polyimide.

TABLE 9

| | Chemical Composition (weight %) | | | | | | | | | | | | |
|---|---|---|---|---|---|---|---|---|---|---|---|---|---|
| No. | Sn | Al | Be | Co | Fe | Mg | Mn | Ni | P | Pb | Si | Ti | Zn | Cu & Unavoidable Impurities |
| 27 | 0.10 | — | 0.11 | 0.21 | — | — | — | — | — | — | — | — | — | Remainder |
| 28 | 0.40 | 0.15 | — | — | — | — | 0.091 | — | 0.045 | — | 0.1 | — | 0.10 | Remainder |
| 29 | 0.21 | — | — | — | — | 0.094 | — | — | — | — | — | 0.31 | — | Remainder |
| 30 | 0.19 | — | — | — | 0.20 | — | — | 0.11 | — | 0.029 | — | — | 0.19 | Remainder |
| 31 | 0.20 | — | — | — | — | — | — | — | 0.050 | — | 0.091 | — | — | Remainder |

TABLE 10

| No. | Tensile Strength (N/mm²) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 27 | 650 | 75 | 390 | 1 | ○ | 12.7 |
| 28 | 580 | 60 | 450 | 1 | ○ | 13.6 |
| 29 | 690 | 63 | 450 | 2 | ○ | 10.5 |
| 30 | 620 | 70 | 400 | 1 | ○ | 12.1 |
| 31 | 550 | 82 | 360 | 1 | ○ | 11.0 |

Table 11 lists the compositions of the copper alloy foils of comparative examples, and Table 12 lists their characteristic evaluation results. Nos. 32–34 are comparative examples related to embodiments of the present invention in which the copper alloy foil contains Ag and/or In and has a heat resistance of at least 300° C. No. 32 is a rolled copper foil to which the alloy components of the present invention were not added. An ingot produced by fusing and casting oxygen-free copper in an Ar atmosphere was processed into foil, after which this was adhered to polyimide. Because the raw material was pure copper, the conductivity was high. However, insufficient adhesive strength (180° peel strength: 7.5 N/cm) was obtained, so there was danger of peeling after use in a printed wiring board.

TABLE 11

| | Chemical Composition (weight %) | | | | | | | |
|---|---|---|---|---|---|---|---|---|
| No. | Sn | Al | Be | Co | Fe | Mg | Mn | Ni |
| 32 | — | — | — | — | — | — | — | — |
| 33 | 0.008 | — | — | — | — | — | — | — |
| 34 | 0.59 | — | — | — | — | — | — | — |
| 35 | 0.22 | — | — | — | 2.9 | — | — | — |
| 36 | 0.20 | — | — | — | — | — | — | — |
| 37 | 0.05 | — | — | — | — | — | — | — |

TABLE 11-continued

| | Chemical Composition (weight %) | | | | | Cu & Unavoidable |
|---|---|---|---|---|---|---|
| No. | P | Pb | Si | Ti | Zn | Impurities |
| 32 | — | — | — | — | — | Remainder |
| 33 | — | — | — | — | — | Remainder |
| 34 | — | — | — | — | — | Remainder |
| 35 | — | — | — | — | — | Remainder |
| 36 | — | — | — | 2.7 | — | Remainder |
| 37 | — | — | — | — | — | Remainder |

TABLE 12

| No. | Tensile Strength (N/mm²) | Conductivity (% IACS) | Heat Resistance (° C.) | Thickness of Anticorrosive Coating (nm) | Varnish Applicability | 180° Peel Strength (N/cm) |
|---|---|---|---|---|---|---|
| 32 | 400 | 99 | 140 | 2 | ○ | 7.5 |
| 33 | 400 | 99 | 250 | 1 | ○ | 7.7 |
| 34 | 550 | 67 | 380 | 1 | ○ | 12.3 |
| 35 | 540 | 30 | 450 | 1 | ○ | 13.1 |
| 36 | 890 | 15 | 450 | 1 | ○ | 12.0 |
| 37 | 450 | 95 | 360 | 7 | X | — |

In Nos. 33 and 34, Sn was added, after which the foil was processed by means of the same method used for the invention examples. Because the Sn concentration was low in No. 33, the conductivity was high. However, the effect was insufficient to improve the heat resistance and the adhesiveness. The 180° peel strength was low, so there was danger of peeling after this was processed to form a laminate. In No. 34, on the other hand, Sn was added in a concentration exceeding 0.5 weight percent, so the heat resistance and the 180° peel strength were high. However, the conductivity dropped below 70% IACS, so it was not suitable as the conductive material of a printed wiring board, which requires high conductivity.

Nos. 35 and 36 are comparative examples related to embodiments of the present invention in which the copper alloy foil contains Ag and/or In and at least one of Al, Be, Co, Fe, Mg, Mn, Ni, P, Pg, Si, Ti and Zn. In addition to Sn, Fe and Ti were added in Nos. 35 and 36, respectively. Then the foil was processed in the same manner as the invention examples. The added amount of Fe or Ti exceeded 2.5 weight percent, so the tensile strength, heat resistance, and adhesiveness were high. However, the conductivity dropped below 60% IACS, making it unsuitable as the conductive material of a printing wiring board.

In comparative Example 37 the copper alloy foil of invention Example 24 was immersed in an aqueous solution with the benzotriazole concentration regulated at 7000 ppm. As a result, as the anticorrosive coating thickened to 7 nm, and the wettability with varnish containing polyamic acid decreased, so varnish repellency was detected. This made it impossible to obtain a uniform polyimide film, so it was impossible to measure the 180° peel strength.

When used for a printed wiring board laminate with varnish containing polyamic acid as the raw material and with thermoset polyimide as the substrate, the copper alloy foil of the present invention has superior adhesiveness with the polyimide, even if the surface roughness of the copper alloy foil is low, and it also has high conductivity. Also, because its strength is high, the foil has superior foil handleability. For these reasons, the foil is ideal for applications requiring a conductive material for an electronic circuit that requires fine wiring.

What is claimed is:

1. A laminate comprising a copper alloy foil laminated with a polyimide substrate formed by thermosetting polyamic acid contained in a varnish, the copper alloy foil having a surface exhibiting no roughening plating processing and the copper alloy foil consisting of at least one of 0.02 to 1.0 weight percent Ag and 0.01 to 0.5 weight percent In, the balance Cu and unavoidable impurities, said surface of the copper alloy foil being coated with an anticorrosive coating of thickness less than 5 nm and comprising benzotriazole or imidazole and onto which coating the varnish containing polyamic acid is applied before said thermosetting, the anticorrosive coating exhibiting good wettability with the varnish containing polyamic acid, and the copper alloy foil exhibiting conductivity of at least 80% IACS and 180° peel strength between the copper alloy foil coated with the anticorrosive coating and the polyimide substrate of at least 8.0 N/cm.

2. A laminate comprising a copper alloy foil laminated with a polyimide substrate formed by thermosetting polyamic acid contained in a varnish, the copper alloy foil having a surface exhibiting no roughening plating processing and the copper alloy foil consisting of at least one of 0.02 to 1.0 weight percent Ag and 0.01 to 0.5 weight percent In, a total of 0.005 to 2.5 weight percent of at least one of Al, Be, Co, Fe, Mg, Mn, Ni, P, Pb, Si, Ti and Zn, the balance Cu and unavoidable impurities, said surface of the copper alloy foil being coated with an anticorrosive coating of thickness less than 5 nm and comprising benzotriazole or imidazole and onto which coating the varnish containing polyamic acid is applied before said thermosetting, the anticorrosive coating exhibiting good wettability of the anticorrosive coating with the varnish containing polyamic acid, and the copper alloy foil exhibiting tensile strength of at least 500 N/mm², conductivity of at least 60% IACS and 180° peel strength between the copper alloy foil coated with the anticorrosive coating and the polyimide substrate of at least 8.0 N/cm.

3. A laminate comprising a copper alloy foil laminated with a polyimide substrate formed by thermosetting polyamic acid contained in a varnish, the copper alloy foil having a surface exhibiting no roughening plating processing and the copper alloy foil consisting of 0.01 to 0.5 weight percent Sn, the balance Cu and unavoidable impurities, said surface of the copper alloy foil being coated with an anticorrosive coating of thickness less than 5 nm and comprising benzotriazole or imidazole and onto which coating the varnish containing polyamic acid is applied before said thermosetting, the anticorrosive coating exhibiting good wettability with the varnish containing polyamic acid, and the copper alloy foil exhibiting conductivity of at least 70% IACS and 180° peel strength between the copper alloy foil coated with the anticorrosive coating and the polyimide substrate of at least 8.0 N/cm.

4. A laminate comprising a copper alloy foil laminated with a polyimide substrate formed by thermosetting polyamic acid contained in a varnish, the copper alloy foil having a surface exhibiting no roughening plating processing and the copper alloy foil consisting of 0.01 to 0.5 weight percent Sn, a total of 0.005 to 2.5 weight percent of at least one of Al, Be, Co, Fe, Mg, Mn, Ni, P, Pb, Si, Ti and Zn, the balance Cu and unavoidable impurities, said surface of the copper alloy foil being coated with an anticorrosive coating of thickness less than 5 nm and comprising benzotriazole or imidazole and onto which coating the varnish containing polyamic acid is applied, the anticorrosive coating exhibiting good wettability with the varnish containing polyamic acid, and the copper alloy foil exhibiting tensile strength of at least 500 N/mm², conductivity of at least 60% IACS and 180° peel strength between the copper alloy foil coated with the anticorrosive coating and the polyimide substrate of at least 8.0 N/cm.

5. A laminate according to any one of claims 1–4, wherein the heat resistance of the copper alloy foil is at least 300° C., the heat resistance of the copper alloy foil being a temperature at which the tensile strength of the copper alloy foil after heating thereof for one hour is intermediate between the tensile strength of the copper alloy foil before said heating thereof and the tensile strength which the copper alloy foil would exhibit after softening thereof.

* * * * *